(12) United States Patent
Li et al.

(10) Patent No.: US 6,794,198 B1
(45) Date of Patent: Sep. 21, 2004

(54) MOCVD SELECTIVE DEPOSITION OF C-AXIS ORIENTED $PB_5GE_3O_{11}$ THIN FILMS ON HIGH-K GATE OXIDES

(75) Inventors: Tingkai Li, Vancouver, WA (US); Sheng Teng Hsu, Camas, WA (US); David R. Evans, Beaverton, OR (US); Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/606,057

(22) Filed: Jun. 25, 2003

(51) Int. Cl.[7] .............................................. H01L 21/00
(52) U.S. Cl. ........................................................ 438/3
(58) Field of Search ............................ 438/3, 239, 479, 438/497; 257/295

(56) References Cited

U.S. PATENT DOCUMENTS

| | | | |
|---|---|---|---|
| 6,190,925 B1 | 2/2001 | Li et al. | |
| 6,229,166 B1 * | 5/2001 | Kim et al. | 257/295 |
| 6,281,022 B1 * | 8/2001 | Li et al. | 438/3 |
| 6,372,034 B1 * | 4/2002 | Zhuang et al. | 438/3 |
| 6,410,343 B1 * | 6/2002 | Li et al. | 438/3 |
| 6,664,116 B2 * | 12/2003 | Li et al. | 438/3 |

* cited by examiner

Primary Examiner—John F. Niebling
Assistant Examiner—Walter L. Lindsay, Jr.
(74) Attorney, Agent, or Firm—David C. Ripma; Matthew D. Rabdau

(57) ABSTRACT

A method of forming a PGO thin film on a high-k dielectric includes preparing a silicon substrate, including forming a high-k gate oxide layer thereon; patterning the high-k gate oxide; annealing the substrate in a first annealing step; placing the substrate in a MOCVD chamber; depositing a PGO thin film by injecting a PGO precursor into the MOCVD chamber; and annealing the structure having a PGO thin film on a high-k gate oxide in a second annealing step.

12 Claims, 2 Drawing Sheets

US 6,794,198 B1

MOCVD SELECTIVE DEPOSITION OF C-AXIS ORIENTED PB₅GE₃O₁₁ THIN FILMS ON HIGH-K GATE OXIDES

FIELD OF THE INVENTION

This invention relates to ferroelectric thin film processes, ferroelectric memory device structures and integrated processes for ferroelectric non-volatile memory devices, and specifically to a method of forming a c-axis oriented PGO thin film on a high-k oxide.

BACKGROUND OF THE INVENTION

Metal, ferroelectric, insulator, and silicon (MFIS) transistor ferroelectric memory devices have been proposed, and c-axis oriented $Pb_5Ge_3O_{11}$ (PGO) thin films exhibit good ferroelectric and electrical properties for one transistor (1T) memory device applications. Extremely high c-axis oriented PGO thin films can be deposited on high-k gate oxides, and working 1T-memory devices with PGO MFIS memory cells have been fabricated. However, the integration process induces damage, such as etching damage, reduces properties of ferroelectric RAM (FRAM) devices, and results in high surface roughness making alignment difficult. In order to resolve these problems, selective deposition processes have been developed to simplify integration processes and improve the properties of MFIS transistor ferroelectric memory devices.

The formation of seed layers for MOCVD of ferroelectric films is described in U. S. patent application Ser. No. 10/020,868, filed May 8, 2001, by Li et al., for *Seed layer processes for MOCVD ferroelectric thin films deposited on high-k gate oxides*.

SUMMARY OF THE INVENTION

A method of forming a PGO thin film on a high-k dielectric includes preparing a silicon substrate, including forming a high-k gate oxide layer thereon; patterning the high-k gate oxide; annealing the substrate in a first annealing step; placing the substrate in a MOCVD chamber; depositing a PGO thin film by injecting a PGO precursor into the MOCVD chamber; and annealing the structure having a PGO thin film on a high-k gate oxide in a second annealing step.

It is an object of the invention to provide a selective deposition method for c-axis PGO thin films on high-k gate oxides, including $ZrO_X$ (X=0–2), $HfO_X$ (X=0–2), $TiO_2$, $Al_2O_3$, $La_2O_3$, and mixtures thereof.

Another object of the invention is to provide for a simplified integration process for c-axis PGO thin films.

A further object of the invention is to provide a PGO MFIS transistor having improved electrical characteristics.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
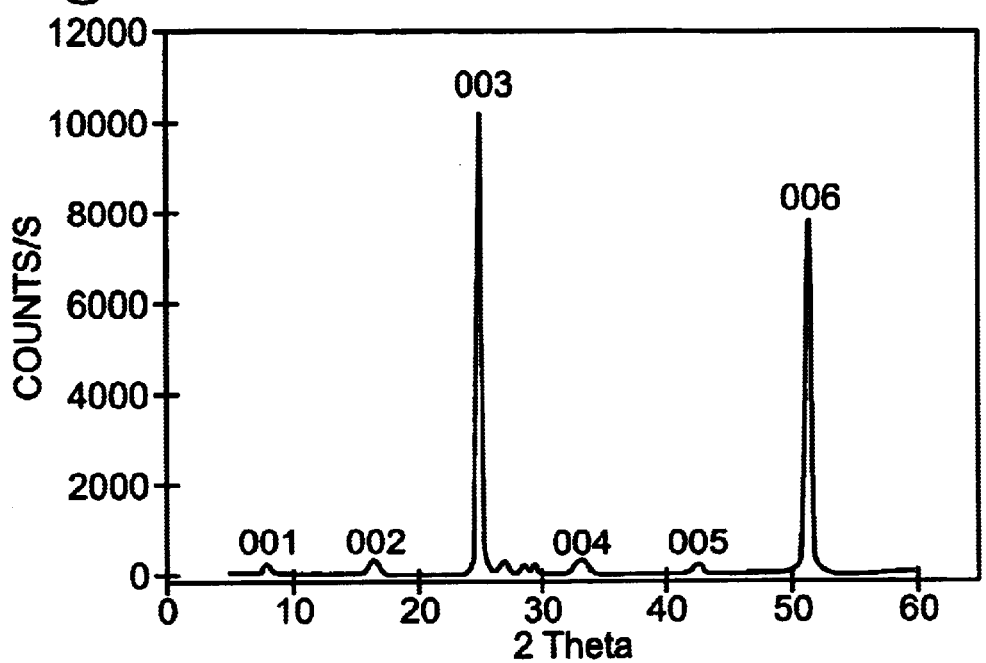
FIG. 1 depicts an x-ray pattern of PGO thin film deposited on a $HfO_2$ gate oxide of a test wafer by the method of the invention.

The method of the invention provides for selective deposition of c-axis $Pb_5Ge_3O_{11}$ (PGO) thin films on high-k gate oxides, including $ZrO_X$ (X=0–2), $HfO_X$ (X=0–2), $TiO_2$, $Al_2O_3$, $La_2O_3$, and mixtures thereof, to simplify the integration processes and improve the properties of PGO MFIS transistor ferroelectric memory devices.

The method of the invention provides for selective growth of ferroelectric PGO thin films on high-k gate oxides for metal, ferroelectrics, insulator, and silicon (MFIS) memory device fabrication. Using the method of the invention, there is no need to etch the ferroelectric material. As a result, etching-induced damage to the ferroelectric layer is avoided. Because of the selective deposition of PGO on patterned high-k gate oxide, other than on a field oxide, the alignment problem is also resolved.

P-type silicon wafers are used as the substrate for a PGO MFIS device. The method of the invention includes providing a silicon wafer, preferably Si (100) wafers, having a $SiO_2$ film deposited thereon. A gate oxide, of high-k material, such as a layer of Hf or $HfO_2$/Hf, having a thickness of between about 3.5 nm to 10 nm, is deposited on the $SiO_2$ film. The Hf or $HfO_2$/Hf film is patterned using chemical mechanical polishing (CMP), or etching. The structure is annealed in a first annealing step in forming gas at between about 400° C. to 450° C. for between about ONE minutes to 40 minutes.

An oxide metal organic chemical vapor deposition (MOCVD) chamber is used for the selective deposition of c-axis oriented $Pb_5Ge_3O_{11}$ thin films on the high-k gate oxide, wherein the structure is masked to prevent deposition of PGO on any exposed $SiO_2$. The structure is again annealed in a second annealing step at a temperature of between about 500° C. to 560° C., for a time of between five minutes to thirty minutes.

The selective MOCVD processes includes preparing [Pb(thd)₂] and [Ge(ETO)₄] in a molar ratio of between about 5 to 5.5:3, which are dissolved in a mixed solvent of butyl ether or tetrahydrofuran, isopropanol and tetraglyme in a molar ratio of about 8:2:1. THD is $C_{11}H_{19}O_2$ and ETO is $OC_2H_5$. The precursor solutions has a concentration of 0.1 mole/liter of PGO. The solution is injected into a vaporizer at temperature in the range of between about 150° C. to 240° C. by a pump at a rate of 0.02 ml/min to 0.2 ml/min to form a precursor gas. The feed line was maintained at a temperature of between about 150° C. to 245° C. Two precesses may be used to form the PGO thin film on the high-k dielectric material:

Process 1: a substrate of $Hf/HfO_2$ or Hf,is prepared prior to deposition of PGO. MOCVD chamber parameters are maintained during the deposition process, which parameters include, in this embodiment of the method of the invention, a deposition temperature of between about 500° C. to 560° C. and a deposition pressure of between about one torr. to ten torr. is maintained in the deposition chamber. The chamber has an oxygen partial pressure of between about 30% to 50%, a vaporizer temperature of between about 180° C. to 200° C., a vaporizer pressure of between about 30 torr. to 50 torr., and a precursor solution delivery rate of between about 0.02 ml/min to 0.2 ml/min, which is maintained for a deposition time of between about one hour to three hours, depending on desired film thickness. The structure is annealed in the second annealing step at a temperature in a range of between about 500° C. to 560° C. for between about five minutes to 30 minutes in an oxygen atmosphere. This results in a PGO thin film having a thickness of between about 50 nm to 1000 nm.

Process 2: A two step deposition processes is used for this embodiment of the method of the invention. In the first step, a selective seed layer of PGO is deposited on a Hf or $HfO_x$ (x=0–2)/Hf layer, at a deposition temperature of between about 500° C. to 560° C. at a pressure of between about 1 torr. to 10 torr, in an atmosphere having an oxygen partial pressure of between about 20% to 50%. The vaporizer temperature is between about 180° C. to 200° C. and the pressure is between about 30 torr. to 50 torr. The precursor solution delivery rate is between about 0.02 ml/min to 0.1 ml/min, and the deposition time is in a range of between about five minutes to twenty minutes. This results in a PGO thin film having a thickness of between about 10 nm to 30 nm.

The second step of the deposition process includes selective deposition of PGO on the PGO seed layer formed in the first step of this process, wherein the deposition temperatures is between about 380° C. to 420° C. and the chamber pressure is between about five torr. and ten torr. The chamber is maintained at an oxygen partial pressure of between about 30% to 40%, at a vaporizer temperature of between about 200° C. to 240° C., and a solution delivery rate of between about 0.1 ml/min to 0.2 ml/min, for a deposition time of between about one hour to three hours, depending on the desired film thickness. The structure is annealed in the second annealing step in an oxygen atmosphere at a temperature in a range of between about 500° C. to 560° C. for between about five minutes to 30 minutes. This results in a PGO thin film having a thickness of between about 50 nm to 1000 nm.

The Experimental Results

The phases of the films were identified using x-ray diffraction. The microstructures are measured by microscope.

Figure 2:
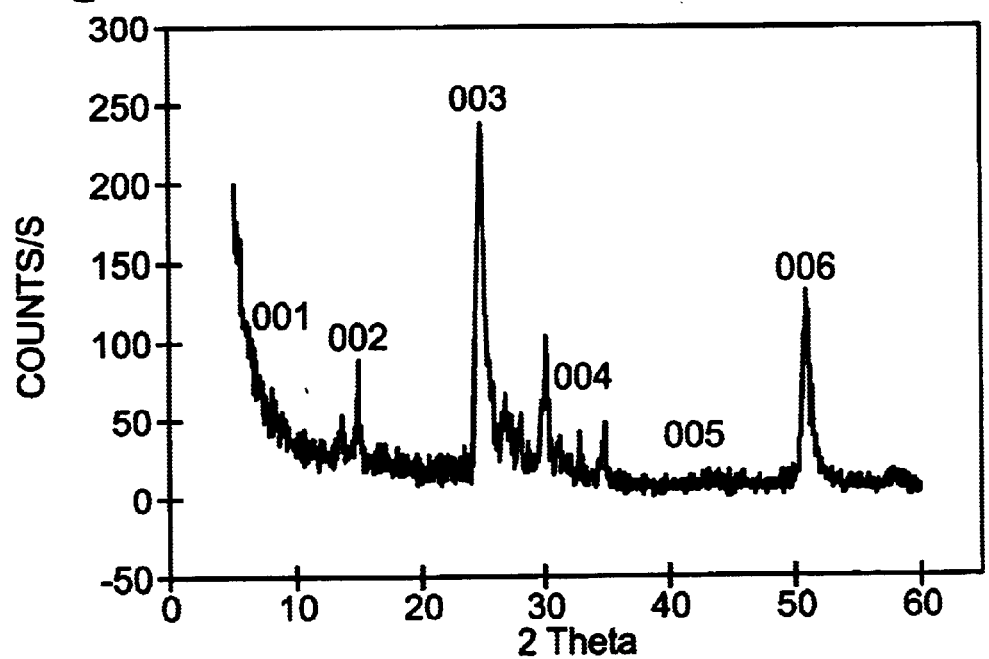
FIG. 2 depicts an x-ray pattern of PGO thin film which has been selectively deposited on a patterned $HfO_X$ device wafer.

FIG. 1 depicts the x-ray pattern of PGO thin film deposited on an $HfO_2$ gate oxide of a test wafer, and demonstrates that an extremely high c-axis oriented PGO thin film is present. FIG. 2 depicts the x-ray pattern of PGO thin film that was selectively deposited on patterned $HfO_x$ (x=0–2) device wafers, and confirms that the selectively deposited thin film on the patterned $HfO_x$ (x=0–2) device wafer is c-axis oriented PGO thin film.

Figure 3:
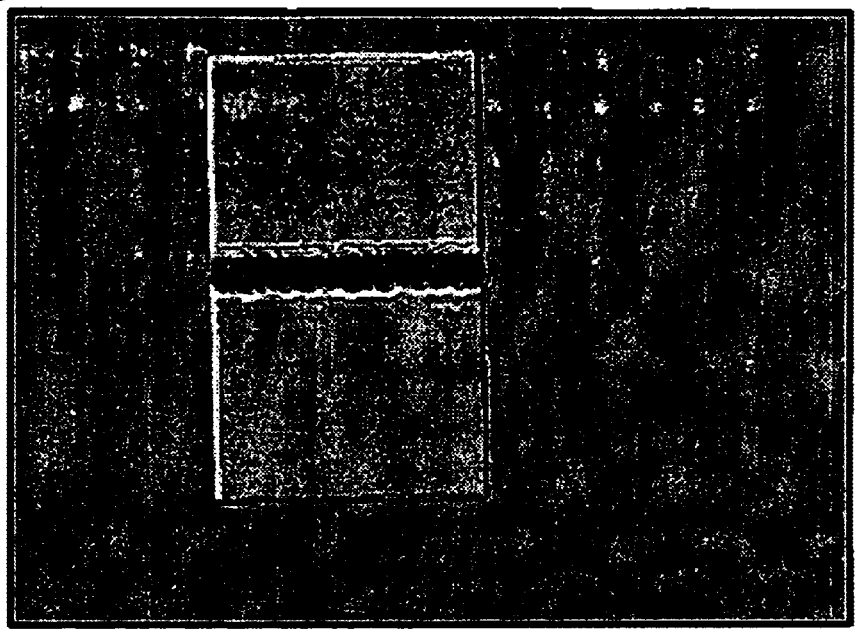
FIG. 3 depicts a microphotograph of selective deposition of a first PGO thin film deposited on $HfO_2$.
Figure 4:
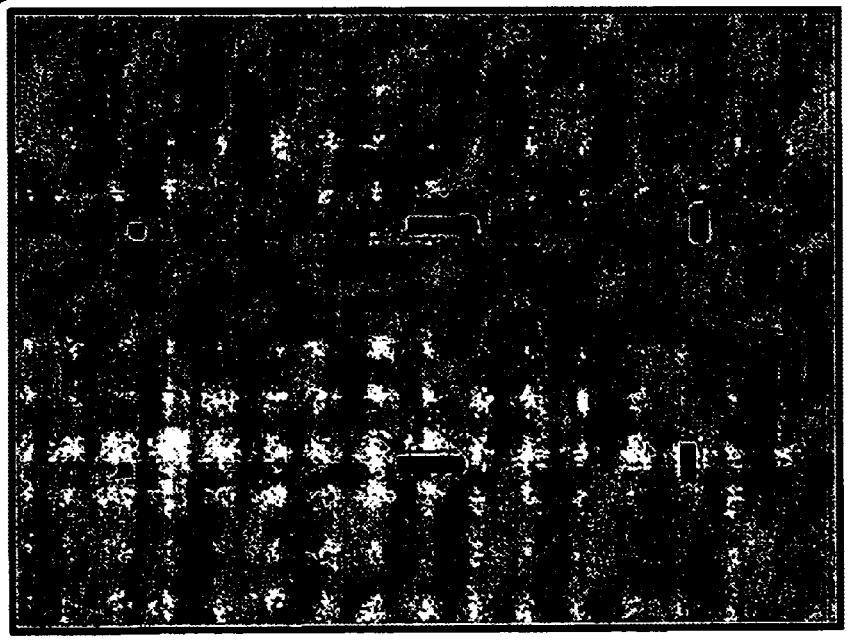
FIG. 4 depicts a microphotographs of selective deposition of a second PGO thin film deposited on $HfO_2$.

FIGS. 3 and 4 depict microphotographs of selective deposition of PGO thin films on $HfO_2$. These figures confirm that PGO thin films have been selectively deposited on $HfO_x$ (x=0–2) gate oxide, other than on $SiO_2$.

Thus, a method for MOCVD selective deposition of c-axis oriented $Pb_5Ge_3O_{11}$ thin films on high-k gate oxides has been disclosed. The method of the invention is significant in that no etching of the PGO thin film is required. It will be appreciated that further variations and modifications thereof may be made within the scope of the invention as defined in the appended claims.

We claim:

1. A method of forming a PGO thin film on a high-k dielectric comprising:
   preparing a silicon substrate, including forming a high-k gate oxide layer thereon;
   patterning the high-k gate oxide;
   annealing the substrate in a first annealing step;
   placing the substrate in a MOCVD chamber;
   depositing a PGO thin film by injecting a PGO precursor into the MOCVD chamber; and
   annealing the structure having a PGO thin film on a high-k gate oxide in a second annealing step.

2. The method of claim 1 which includes preparing a precursor solution by mixing $[Pb(thd)_2]$, where thd is $C_{11}H_{19}Q_2$, and $[Ge(ETO)_4]$, where ETO is $OC_2H_5$, in a molar ratio of between about 5 to 5.5:3; dissolving the mixture in a mixed solvent taken from the group of solvents consisting of butyl ether, and tetrahydrofuran, isopropanol and tetraglyme in a molar ratio of about 8:2:1, so that the precursor solution has a concentration of 0.1 mole/liter of PGO.

3. The method of claim 2 wherein said injecting includes injecting the precursor solution into a vaporizer associated with the MOCVD chamber at temperature in the range of between about 150° C. to 240° C., at a rate of 0.02 ml/min to 0.2 ml/min to form a precursor gas, while maintaining a feed line to the vaporizer at a temperature of between about 150° C. to 245° C.

4. The method of claim 1 wherein said patterning includes patterning by a technique taken from the group of techniques consisting of chemical mechanical polishing (CMP) and etching.

5. The method of claim 1 wherein said depositing a PGO thin films includes maintaining MOCVD chamber parameters, including maintaining the temperature in the MOCVD chamber in a temperature range of between about 500° C. to 560° C.; maintaining the pressure in the MOCVD chamber at between about one torr. to ten torr.; maintaining an oxygen partial pressure in the MOCVD chamber of between about 30% to 50%, holding the vaporizer temperature at a temperature range of between about 180° C. to 200° C., and holding a vaporizer pressure at a pressure of between about 30 torr. to 50 torr., and providing a precursor solution delivery rate of between about 0.02 ml/min to 0.2 ml/min, and maintaining the MOCVD chamber parameters for a deposition time of between about one hour to three hours; and annealing the structure in a second annealing step at a temperature in a range of between about 500° C. to 560° C. for between about five minutes to 30 minutes in an oxygen atmosphere.

6. The method of claim 1 wherein said depositing a PGO thin films includes maintaining MOCVD chamber parameters, including maintaining the temperature at a deposition temperature of between about 500° C. to 560° C. at a pressure of between about 1 torr. to 10 torr, in an atmosphere having an oxygen partial pressure of between about 20% to 50%; a vaporizer temperature of between about 180° C. to 200° C.; a chamber pressure of between about 30 torr. to 50 torr.; a precursor solution delivery rate of between about 0.02 ml/min to 0.1 ml/min, and a deposition time is in a range of between about five minutes to twenty minutes, depositing another layer of PGO on the PGO, wherein the deposition temperatures is between about 380° C. to 420° C.; the chamber pressure is between about five torr. and ten torr.; the chamber is maintained at an oxygen partial pressure of between about 30% to 40%, at a vaporizer temperature of between about 200° C. to 240° C., and a solution delivery rate of between about 0.1 ml/min to 0.2 ml/min, for a deposition time of between about one hour to three hours; annealing the structure in a second annealing step in an oxygen atmosphere at a temperature in a range of between about 500° C. to 560° C. for between about five minutes to 30 minutes.

7. A method of forming a PGO thin film on a high-k dielectric comprising:
preparing a silicon substrate, including forming a layer of silicon dioxide thereon and forming a high-k gate oxide layer on the silicon dioxide;
patterning the high-k gate oxide;
annealing the substrate in a first annealing step at a temperature in a range of between about 400° C. to 450° C. for between about zero minutes and 40 minutes;
placing the substrate in a MOCVD chamber;
preparing a PGO precursor;
depositing a PGO thin film by injecting the PGO precursor into the MOCVD chamber; and
annealing the structure having a PGO thin film on a high-k gate oxide in a second annealing step.

8. The method of claim 7 wherein said preparing a precursor solution includes mixing [Pb(thd)$_2$], where thd is $C_{11}H_{19}O_2$, and [Ge(ETO)$_4$], where ETO is $OC_2H_5$, in a molar ratio of between about 5 to 5.5:3; dissolving the mixture in a mixed solvent taken from the group of solvents consisting of butyl ether, and tetrahydrofuran, isopropanol and tetraglyme in a molar ratio of about 8:2:1, so that the precursor solution has a concentration of 0.1 mole/liter of PGO.

9. The method of claim 8 wherein said injecting includes injecting the precursor solution into a vaporizer associated with the MOCVD chamber at temperature in the range of between about 150° C. to 240° C., at a rate of 0.02 ml/min to 0.2 ml/min to form a precursor gas, while maintaining a feed line to the vaporizer at a temperature of between about 150° C. to 245° C.

10. The method of claim 7 wherein said patterning includes patterning by a technique taken from the group of techniques consisting of chemical mechanical polishing (CMP) and etching.

11. The method of claim 7 wherein said depositing a PGO thin films includes maintaining MOCVD chamber parameters, including maintaining the temperature in the MOCVD chamber in a temperature range of between about 500° C. to 560° C.; maintaining the pressure in the MOCVD chamber at between about one torr. to ten torr.; maintaining an oxygen partial pressure in the MOCVD chamber of between about 30% to 50%, holding the vaporizer temperature at a temperature range of between about 180° C. to 200° C., and holding a vaporizer pressure at a pressure of between about 30 torr. to 50 torr., and providing a precursor solution delivery rate of between about 0.02 ml/min to 0.2 ml/min, and maintaining the MOCVD chamber parameters for a deposition time of between about one hour to three hours; and annealing the structure in a second annealing step at a temperature in a range of between about 500° C. to 560° C. for between about five minutes to 30 minutes in an oxygen atmosphere.

12. The method of claim 7 wherein said depositing a PGO thin films includes maintaining MOCVD chamber parameters, including maintaining the temperature at a deposition temperature of between about 500° C. to 560° C. at a pressure of between about 1 torr. to 10 torr, in an atmosphere having an oxygen partial pressure of between about 20% to 50%; a vaporizer temperature of between about 180° C. to 200° C.; a chamber pressure of between about 30 torr. to 50 torr.; a precursor solution delivery rate of between about 0.02 ml/min to 0.1 ml/min, and a deposition time is in a range of between about five minutes to twenty minutes, depositing another layer of PGO on the PGO, wherein the deposition temperatures is between about 380° C. to 420° C.; the chamber pressure is between about five torr. and ten torr.; the chamber is maintained at an oxygen partial pressure of between about 30% to 40%, at a vaporizer temperature of between about 200° C. to 240° C., and a solution delivery rate of between about 0.1 ml/min to 0.2 ml/min, for a deposition time of between about one hour to three hours; annealing the structure in a second annealing step in an oxygen atmosphere at a temperature in a range of between about 500° C. to 560° C. for between about five minutes to 30 minutes.

* * * * *